United States Patent
Mishra et al.

(10) Patent No.: US 8,039,352 B2
(45) Date of Patent: Oct. 18, 2011

(54) POLARIZATION-INDUCED BARRIERS FOR N-FACE NITRIDE-BASED ELECTRONICS

(75) Inventors: Umesh K. Mishra, Montecito, CA (US); Tomas A. Palacios Gutierrez, Cambridge, MA (US); Man-Hoi Wong, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 377 days.

(21) Appl. No.: 12/127,661

(22) Filed: May 27, 2008

(65) Prior Publication Data

US 2009/0218599 A1   Sep. 3, 2009

Related U.S. Application Data

(60) Provisional application No. 60/940,052, filed on May 24, 2007.

(51) Int. Cl.
   *H01L 21/331* (2006.01)
   *H01L 21/8222* (2006.01)
   *H01L 21/338* (2006.01)

(52) U.S. Cl. .......... 438/312; 438/172; 257/E21.04; 257/E21.403

(58) Field of Classification Search ............ 438/172, 438/285, 312; 257/E21.04, E21.403
   See application file for complete search history.

(56) References Cited

U.S. PATENT DOCUMENTS

| | | | |
|---|---|---|---|
| 6,177,685 B1 | 1/2001 | Teraguchi et al. | |
| 6,624,452 B2 | 9/2003 | Yu et al. | |
| 6,849,882 B2 | 2/2005 | Mishra et al. | |
| 7,030,428 B2 | 4/2006 | Saxler | |
| 2008/0099755 A1 * | 5/2008 | Tansu et al. | 257/14 |

OTHER PUBLICATIONS

International Search Report mailed Aug. 26, 2008, International application No. PCT/US08/64906.
Ambacher et al., "Two dimensional electron gases induced by spontaneous and piezoelectric polarization in undoped and doped AlGaN/GaN heterostructures," J. Appl. Phys., vol. 87, No. 1, Jan. 1, 2000, pp. 334-344.
Unlu et al, "Band offsets in III-nitride heterostructures," J. Phys. D: Appl. Phys. 35 (2002) 591-594.
Wong et al., "N-face high electron mobility transistors with GaN-spacer," Phys. Stat. Sol. (a) 204, No. 6 (2007) 2049-2053.
Chini et al., "Fabrication and Characterization of N-face GaN/AlGaN/GaN HEMTs," 63rd Device Research Conference, Jun. 20-22, 2005, Santa Barbara, CA, pp. 63-64.
Palacios et al., "AlGaN/GaN High Electron Mobility Transistors With InGaN Back-Barriers," IEEE Electron Device Letters, vol. 27, No. 1, Jan. 2006, pp. 13-15.

(Continued)

Primary Examiner — Alexander Ghyka
Assistant Examiner — Seahvosh J Nikmanesh
(74) Attorney, Agent, or Firm — Gates & Cooper LLP

(57) ABSTRACT

A method for fabricating a potential barrier for a nitrogen-face (N-face) nitride-based electronic device, comprising using a thickness and polarization induced electric field of a III-nitride interlayer, positioned between a first III-nitride layer and a second III-nitride layer, to shift, e.g., raise or lower, the first III-nitride layer's energy band with respect to the second III-nitride layer's energy band by a pre-determined amount. The first III-nitride layer and second III-nitride layer each have a higher or lower polarization coefficient than the III-nitride interlayer's polarization coefficient.

10 Claims, 11 Drawing Sheets

OTHER PUBLICATIONS

Rajan et al. "Growth and Electrical Characterization of N-face AlGaN/GaN Heterostructures," Japanese Journal of Applied Physics, vol. 44, No. 49, 2005, pp. L1478-L1480.

Rajan et al., "N-polar GaN/AlGaN/GaN high electron mobility transistors," J. Appl. Phys., vol. 102, No. 4, Aug. 2007, pp. 44501-1-44501-6.

Chini, A. et al., "An experimental method to identify bulk and surface traps in GaN HEMTs," 32$^{nd}$ International Symposium on Compound Semiconductors (ISCS), Sep. 18-22, 2005, Europa-Park Rust, Germany.

Rajan, S. et al., "Advanced transistor structures based on N-face GaN," 32$^{nd}$ International Symposium on Compound Semiconductors (ISCS), Sep. 18-22, 2005, Europa-Park Rust, Germany.

Rajan, S. et al., "N-face AlGaN/GaN modulation-doped field effect transistors," 6$^{th}$ International Conference on Nitridge Semiconductors (ICNS) 2005, Aug. 28-Sep. 2, 2005, Bremen, Germany.

Rajan, S. et al., "Structural and electrical characterization of n-face GaN grown on c-face SiC by MBE," 47$^{th}$ Electronic Materials Conference, Jun. 22-24, 2005, Santa Barbara, California USA.

* cited by examiner

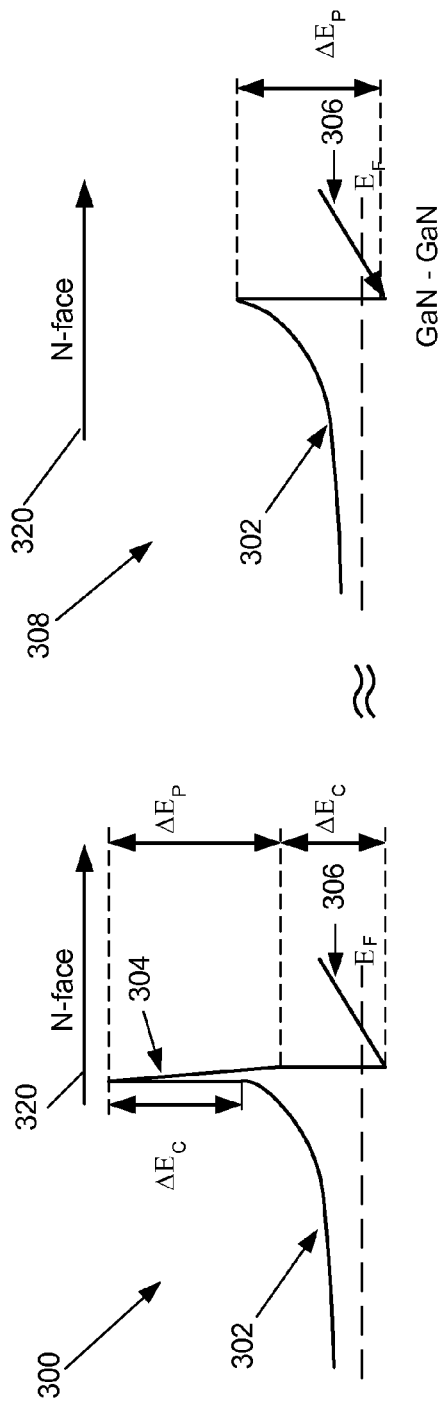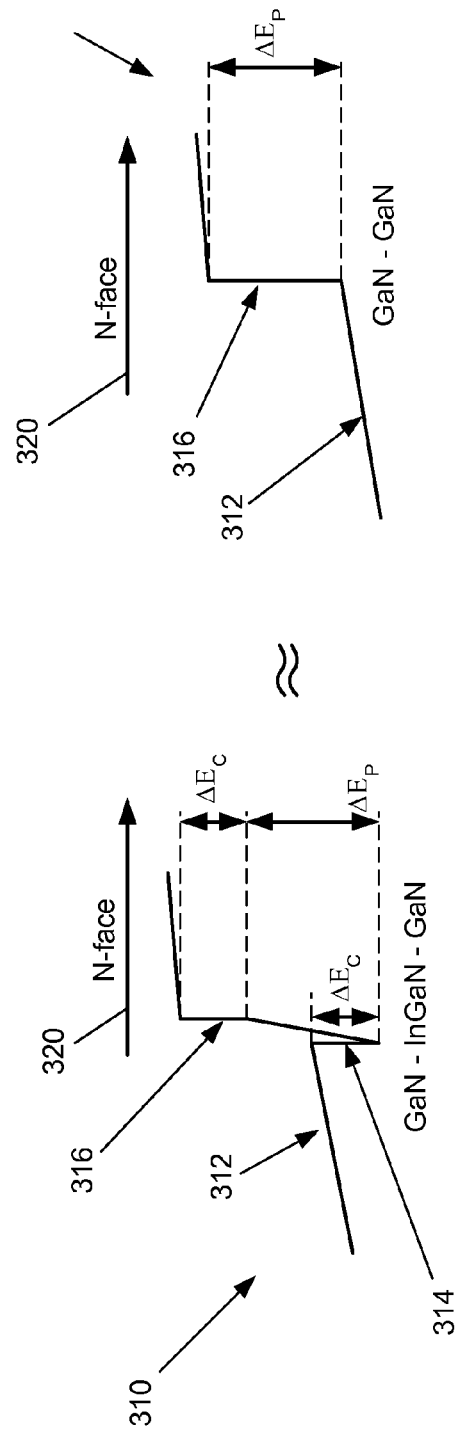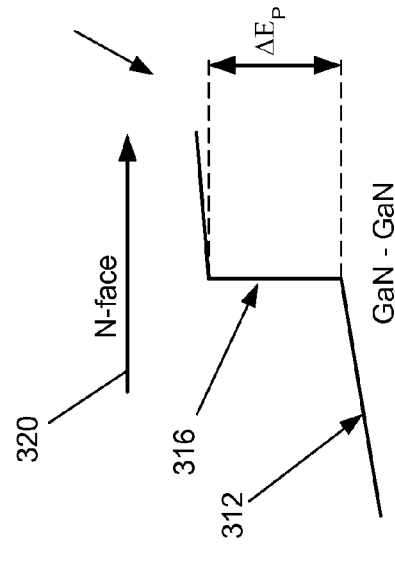

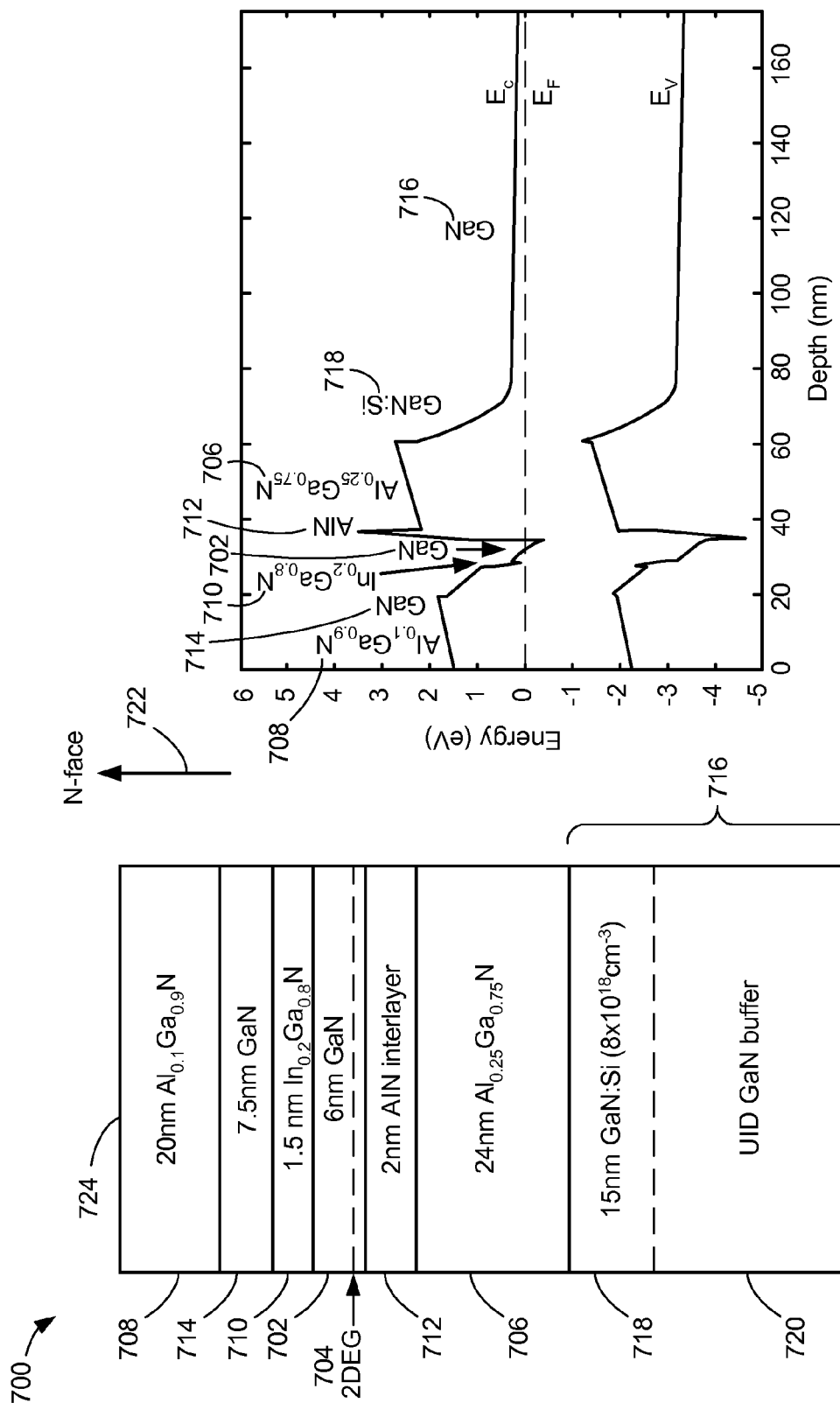

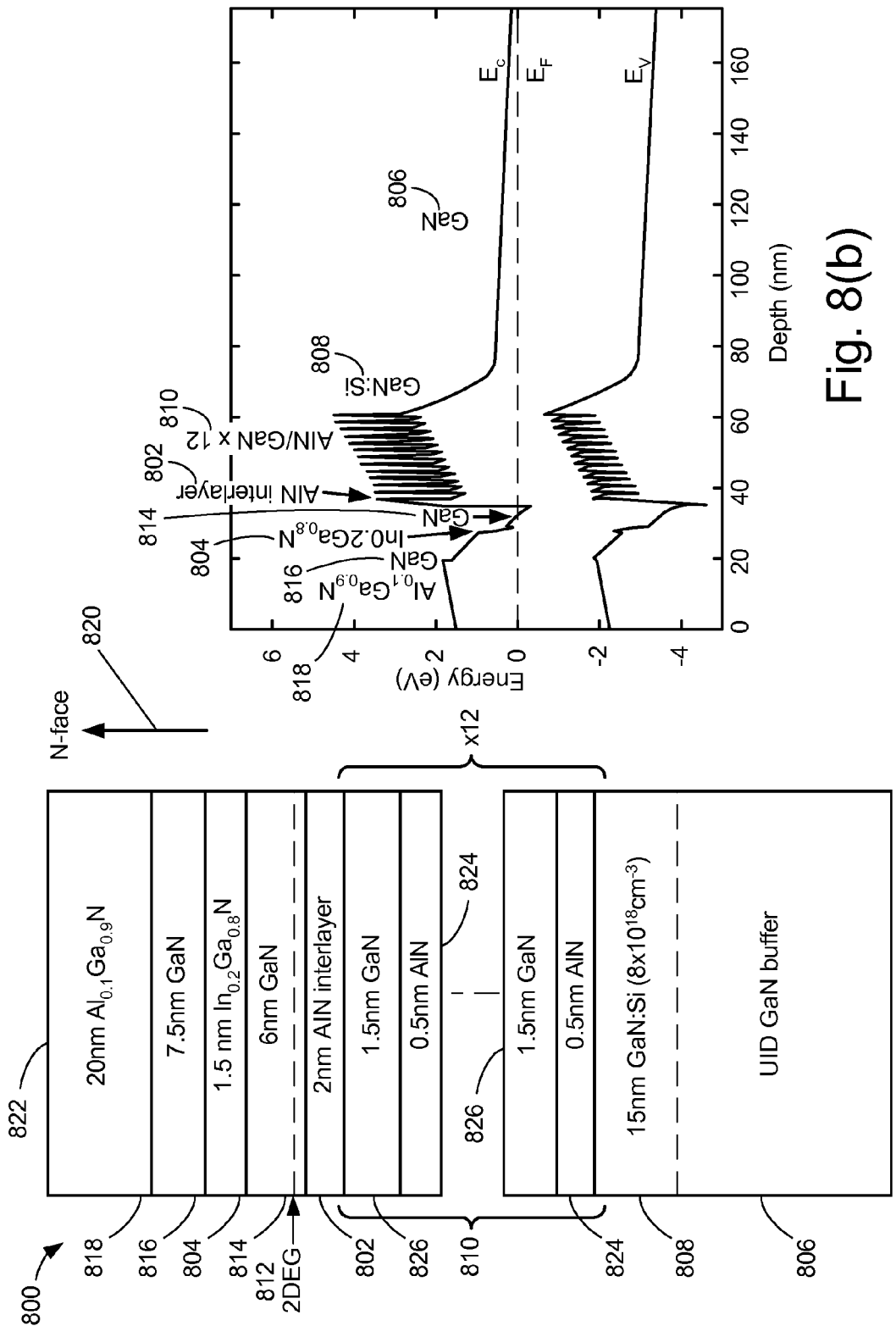

POLARIZATION-INDUCED BARRIERS FOR N-FACE NITRIDE-BASED ELECTRONICS

CROSS-REFERENCE TO RELATED APPLICATIONS

This application claims the benefit under 35 U.S.C. Section 119(e) of commonly-assigned U.S. Provisional Patent Application Ser. No. 60/940,052 filed on May 24, 2007, by Umesh K. Mishra, Tomas Palacios, and Man Hoi Wong, entitled "POLARIZATION-INDUCED BARRIERS FOR N-FACE NITRIDE-BASED ELECTRONICS", which application is incorporated by reference herein.

This application is related to the following commonly-assigned applications:

U.S. Utility patent application Ser. No. 11/768,105, filed Jun. 25, 2007, by Michael Grundmann and Umesh K. Mishra, entitled "POLARIZATION INDUCED TUNNEL JUNCTION", which application claims priority under 35 U.S.C. Section 119(e) of U.S. Provisional Patent Application Ser. No. 60/815,944, filed on Jun. 23, 2006, by Michael Grundmann and Umesh K. Mishra, entitled "POLARIZATION INDUCED TUNNEL JUNCTION";

U.S. Utility patent application Ser. No. 11/855,591, filed on Sep. 14, 2007, now U.S. Pat. No. 7,566,580, issued Jul. 28, 2009, by Nicholas A. Fichtenbaum, Umesh K. Mishra, and Stacia Keller, entitled "METHOD FOR HETEROEPITAXIAL GROWTH OF HIGH-QUALITY N-FACE GaN, InN, AND AlN AND THEIR ALLOYS BY METAL ORGANIC CHEMICAL VAPOR DEPOSITION", which application claims priority under 35 U.S.C. Section 119(e) of U.S. Provisional Patent Application Ser. No. 60/866,035, filed on Nov. 15, 2006, by Nicholas A. Fichtenbaum, Umesh K. Mishra, and Stacia Keller, entitled "METHOD FOR HETEROEPITAXIAL GROWTH OF HIGH-QUALITY N-FACE GaN, InN, and AlN AND THEIR ALLOYS BY METAL ORGANIC CHEMICAL VAPOR DEPOSITION";

U.S. Utility patent application Ser. No. 11/940,856, filed on Nov. 15, 2007, by Nicholas A. Fichtenbaum, Umesh K. Mishra, and Stacia Keller, entitled "LIGHT EMITTING DIODE AND LASER DIODE USING N-FACE GaN, InN, and AlN AND THEIR ALLOYS"; which application claims priority under 35 U.S.C. Section 119(e) of U.S. Provisional Patent Application Ser. No. 60/866,019, filed on Nov. 15, 2006, by Nicholas A. Fichtenbaum, Umesh K. Mishra, and Stacia Keller, entitled "LIGHT EMITTING DIODE AND LASER DIODE USING N-FACE GaN, InN, and AlN AND THEIR ALLOYS";

U.S. Utility patent application Ser. No. 12/059,902 filed on Mar. 31, 2008, now U.S. Pat. No. 7,935,985, issued May 3, 2011, by Umesh K. Mishra, Yi Pei, Siddharth Rajan, and Man Hoi Wong, entitled "N-FACE HIGH ELECTRON MOBILITY TRANSISTORS WITH LOW BUFFER LEAKAGE AND LOW PARASITIC RESISTANCE", which application claims priority under 35 U.S.C. Section 119(e) of U.S. Provisional Patent Application Ser. No. 60/908,914 filed on Mar. 29, 2007, by Umesh K. Mishra, Yi Pei, Siddharth Rajan, and Man Hoi Wong, entitled "N-FACE HIGH ELECTRON MOBILITY TRANSISTORS WITH LOW BUFFER LEAKAGE AND LOW PARASITIC RESISTANCE";

U.S. Utility patent application Ser. No. 12/059,907, filed on Mar. 31, 2008, by Umesh K. Mishra, Lee S. McCarthy, Chang Soo Suh and Siddharth Rajan, entitled "METHOD TO FABRICATE III-N SEMICONDUCTOR DEVICES ON THE N-FACE OF LAYERS WHICH ARE GROWN IN THE III-FACE DIRECTION USING WAFER BONDING AND SUBSTRATE REMOVAL," which application claims priority under 35 U.S.C. Section 119(e) of U.S. Provisional Patent Application Ser. No. 60/908,917, filed on Mar. 29, 2007, by Umesh K. Mishra, Lee S. McCarthy, Chang Soo Suh and Siddharth Rajan, entitled "METHOD TO FABRICATE III-N SEMICONDUCTOR DEVICES ON THE N-FACE OF LAYERS WHICH ARE GROWN IN THE III-FACE DIRECTION USING WAFER BONDING AND SUBSTRATE REMOVAL,";

U.S. Utility patent application Ser. No. 12/059,918 filed on Mar. 31, 2008, by Umesh K. Mishra, Michael Grundmann, Steven P. DenBaars, and Shuji Nakamura, entitled "DUAL SURFACE ROUGHENED N-FACE HIGH BRIGHTNESS LED", which application claims priority under 35 U.S.C. Section 119(e) of U.S. Provisional Patent Application Ser. No. 60/908,919 filed on Mar. 29, 2007, by Umesh K. Mishra, Michael Grundmann, Steven P. DenBaars, and Shuji Nakamura, entitled "DUAL SURFACE ROUGHENED N-FACE HIGH BRIGHTNESS LED"; and U.S. Utility patent application Ser. No. 12/131,704 filed on Jun. 2, 2008, now U.S. Pat. No. 7,728,356, issued Jun. 1, 2010, by Chang Soo Suh and Umesh K. Mishra, entitled "P—GaN/AlGaN/AlN/GaN ENHANCEMENT-MODE FIELD EFFECT TRANSISTOR", which application claims priority under 35 U.S.C. Section 119(e) of U.S. Provisional Patent Application Ser. No. 60/941,580 filed on Jun. 1, 2007, by Chang Soo Suh and Umesh K. Mishra, entitled "P—GaN/AlGaN/AlN/GaN ENHANCEMENT-MODE FIELD EFFECT TRANSISTOR", which applications are incorporated by reference herein.

STATEMENT REGARDING FEDERALLY SPONSORED RESEARCH AND DEVELOPMENT

This invention was made with Government support under Grant No. N00014-05-1-0419 MINE MURI (ONR) and Grant No. F49620-03-1-0235 (AFRL). The Government has certain rights in this invention.

BACKGROUND OF THE INVENTION

1. Field of the Invention

The present invention relates to polarization-induced barriers for nitrogen-face (N-face) nitride-based electronics.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Gallium nitride (GaN) is a wide bandgap semiconductor with multiple applications in electronics and optoelectronics. This material, and its alloys with aluminum (Al) and indium (In), presents two different faces when grown along the c-direction. FIG. 1 shows these two faces, or polarities, which are the Ga-face (0001) 100 and the N-face (000-1) 102, and the lattice positions of Ga 104 and N atoms 106. Most of the electronic and optoelectronic devices developed in this material until now have been fabricated on the Ga-face.

Recently, our group has exploited the use of N-face AlGaN semiconductors to develop new electronic devices with improved performance [1-7]. Some examples include depletion mode high electron mobility transistors (HEMTs) with lower gate current, and enhancement-mode HEMTs, etc.

However, there remains a need in the art for improved N-face nitride-based electronics, and methods of making the same. The present invention satisfies that need.

SUMMARY OF THE INVENTION

To overcome the limitations in the prior art described above, and to overcome other limitations that will become apparent upon reading and understanding the present specification, the present invention describes a new method to introduce potential barriers in the band diagram of N-face nitride-based electronic and optoelectronic devices is presented. This new method includes the growth of ultra-thin layers of AlGaN or InGaN wherever a potential barrier is needed. The very high polarization-induced electric field present in these ultra-thin layers lowers or raises the conduction band at one side of this ultra-thin layer with respect to the other side. This effect can be used to modify the confinement of the electrons. A similar analysis can be applied to the valence band to modify the confinement of holes.

Many applications can be envisioned for this new technology. Some of these applications are AlN back-barriers to reduce the alloy scattering of the channel electrons and increase their mobility, and InGaN top-barriers to reduce the gate leakage and increase the confinement of the channel electrons.

The present invention also discloses a method for fabricating an N-face nitride-based electronic device, comprising using a thickness and polarization induced electric field of a III-nitride interlayer, positioned between a first III-nitride layer and a second III-nitride layer, to shift, e.g., raise or lower, the first III-nitride layer's energy band with respect to the second III-nitride layer's energy band by a pre-determined amount, wherein (1) both the first III-nitride layer and the second III-nitride layer have a different polarization coefficient than the III-nitride interlayer's polarization coefficient, (2) both the first III-nitride layer and the second III-nitride layer have a group III composition different than the group III composition of the III-nitride interlayer, and (3) the pre-determined amount is proportional to the thickness and the polarization induced electric field of the III-nitride interlayer.

The III-nitride interlayer may interface or form a junction between the first III-nitride layer and the second III-nitride layer. The first III-nitride layer and the second III-nitride layer may have the same III-nitride composition. The first III-nitride layer and the second III-nitride layer may be selected from a group comprising GaN or AlGaN, and the III-nitride interlayer is selected from a group comprising InGaN or AlInGaN. The first III-nitride layer and second III-nitride layer may be selected from a group comprising GaN or (Al)InGaN, and the III-nitride interlayer is Al(In)GaN. The pre-determined amount may be in excess of 0.2 eV.

A device may be fabricated using the method.

The device may be a High Electron Mobility Transistor (HEMT), wherein the first III-nitride layer is a barrier layer of the HEMT, the second III-nitride layer is a channel layer containing channel electrons of the HEMT, and the III-nitride interlayer is a back-barrier positioned between the channel layer and the barrier layer to reduce alloy scattering of channel electrons and increase their mobility compared to a device without the III-nitride interlayer.

The device may be a High Electron Mobility Transistor (HEMT), wherein the first III-nitride layer is a channel layer containing channel electrons of the HEMT, the second III-nitride layer is a cap layer beneath a gate of the HEMT, and the III-nitride interlayer is a top-barrier positioned between the channel layer and the cap layer so that the gate has reduced gate leakage and the channel electrons experience enhanced confinement compared to a device without the III-nitride interlayer.

The device may further comprise a GaN spacer layer positioned between the first III-nitride layer and the second III-nitride layer, wherein the first III-nitride layer is a III-nitride back-barrier interlayer for containing channel electrons, the second III-nitride semiconductor layer acts as a barrier layer, and the GaN spacer layer introduces an additional separation between the channel layer and the barrier layer to lower alloy scattering as compared to a device without the GaN spacer layer.

The present invention further discloses a device structure for creating a polarization induced potential barrier, comprising a III-nitride interlayer positioned between a first III-nitride layer and a second III-nitride layer, wherein at least one of the first III-nitride layer and the second III-nitride layer has a different polarization coefficient than the III-nitride interlayer; and a potential barrier for increasing an energy band discontinuity between the first III-nitride layer and the second III-nitride layer, which is created and determined by (1) a thickness of the III-nitride interlayer; and (2) a polarization induced electric field of the III-nitride interlayer.

The device structure may be a HEMT, for example, wherein the first III-nitride layer is an (Al,Ga,In)N channel layer, for containing a two dimensional electron gas (2DEG); the second III-nitride layer is an $Al_xGa_{1-x}N$ barrier layer, with $0 \leq x \leq 1$, positioned to confine the 2DEG in the (Al,Ga,In)N channel layer; the III-nitride interlayer is positioned between the $Al_xGa_{1-x}N$ barrier layer and the (Al,Ga,In)N channel layer; the III-nitride interlayer has a higher polarization coefficient (i.e., spontaneous plus piezoelectric polarization) than the $Al_xGa_{1-x}N$ barrier layer and the (Al,Ga,In)N channel layer, and the thickness and the polarization induced electric field of the III-nitride interlayer increases the potential barrier between the $Al_xGa_{1-x}N$ barrier layer and the (Al,Ga,In)N channel layer and reduces alloy scattering with the barrier layer.

The III-nitride interlayer may be $Al_yGa_{1-y}N$ with y>x. The III-nitride interlayer may be $In_yAl_xGa_{1-x-y}N$ with x+y=1.

The device structure may further comprise a GaN spacer layer positioned between the $Al_xGa_{1-x}N$ barrier layer and the III-nitride interlayer. The III-nitride interlayer may interface the GaN spacer layer and the (Al,Ga,In)N channel, and the GaN spacer may interface the III-nitride interlayer and the $Al_xGa_{1-x}N$ barrier.

The device structure may be used for an N-face high electron mobility transistor (HEMT), for example, wherein the first III-nitride layer is a cap layer; the second III-nitride layer is an (Al,Ga,In)N channel layer for containing a two dimensional electron gas (2DEG); an (Al,Ga,In)N barrier layer is positioned to confine the 2DEG in the (Al,Ga,In)N channel layer; the (Al,Ga,In)N channel layer is positioned between the cap layer and the (Al,Ga,In)N barrier layer; the III-nitride interlayer is a top-barrier layer, positioned between the III-nitride cap and the (Al,Ga,In)N channel layer, for providing a top-barrier to confine the 2DEG in the channel layer; the III-nitride top-barrier layer has a lower polarization coefficient than the (Al,Ga,In)N channel layer and the III-nitride cap layer; and the thickness and the polarization induced electric field of the III-nitride top-barrier layer increases the potential barrier between the channel layer and the III-nitride cap layer, thereby increasing confinement of the 2DEG in the channel layer. The interlayer, barrier layer, and channel layer each may have an N-face orientation.

The III-nitride top-barrier layer may be InGaN and has a quantum well-like band diagram.

The device structure may further comprise a III-nitride back-barrier positioned between the $Al_xGa_{1-x}N$ barrier layer and the (Al,Ga,In)N channel layer; a first GaN spacer layer positioned between the III-nitride back-barrier and the $Al_xGa_{1-x}N$ barrier layer; and a second GaN spacer layer positioned between the III-nitride top-barrier layer and III-nitride cap layer.

The thickness of the III-nitride interlayer may be less than 20 nm or small enough such that the III-nitride interlayer has strain or is not relaxed due to lattice mismatch with at least one of the first III-nitride layer and the second III-nitride layer.

BRIEF DESCRIPTION OF THE DRAWINGS

Referring now to the drawings in which like reference numbers represent corresponding parts throughout:

FIG. 3($a$) is a schematic of the conduction band for a GaN/ultrathin AlN/GaN pseudoheterojunction, FIG. 3($b$) is a schematic of a conduction band approximating the conduction band of FIG. 3($a$), FIG. 3($c$) is a schematic of the conduction band for a GaN/ultrathin InGaN/GaN pseudoheterojunction, and FIG. 3($d$) is a schematic of a conduction band approximating the conduction band of FIG. 3($c$).

FIG. 7($a$) is a schematic of an N-face HEMT with AlN interlayer and InGaN top-barrier, and FIG. 7($b$) is the band diagram through the structure of FIG. 7($a$).

FIG. 8($a$) is a schematic of an N-face HEMT with AlN interlayer, InGaN top-barrier, and digital AlGaN barrier, and FIG. 8($b$) is the band diagram through the structure of FIG. 8($a$).

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

The lack of inversion symmetry in nitride-based semiconductors, in combination with the very high electronegativity of the nitrogen atom, induces a strong polarization in these semiconductors. When two GaN-based alloys are grown one on top of the other, the difference in polarization properties induces fixed sheets of charge at the interfaces, as shown in FIG. 2.

Figure 1:
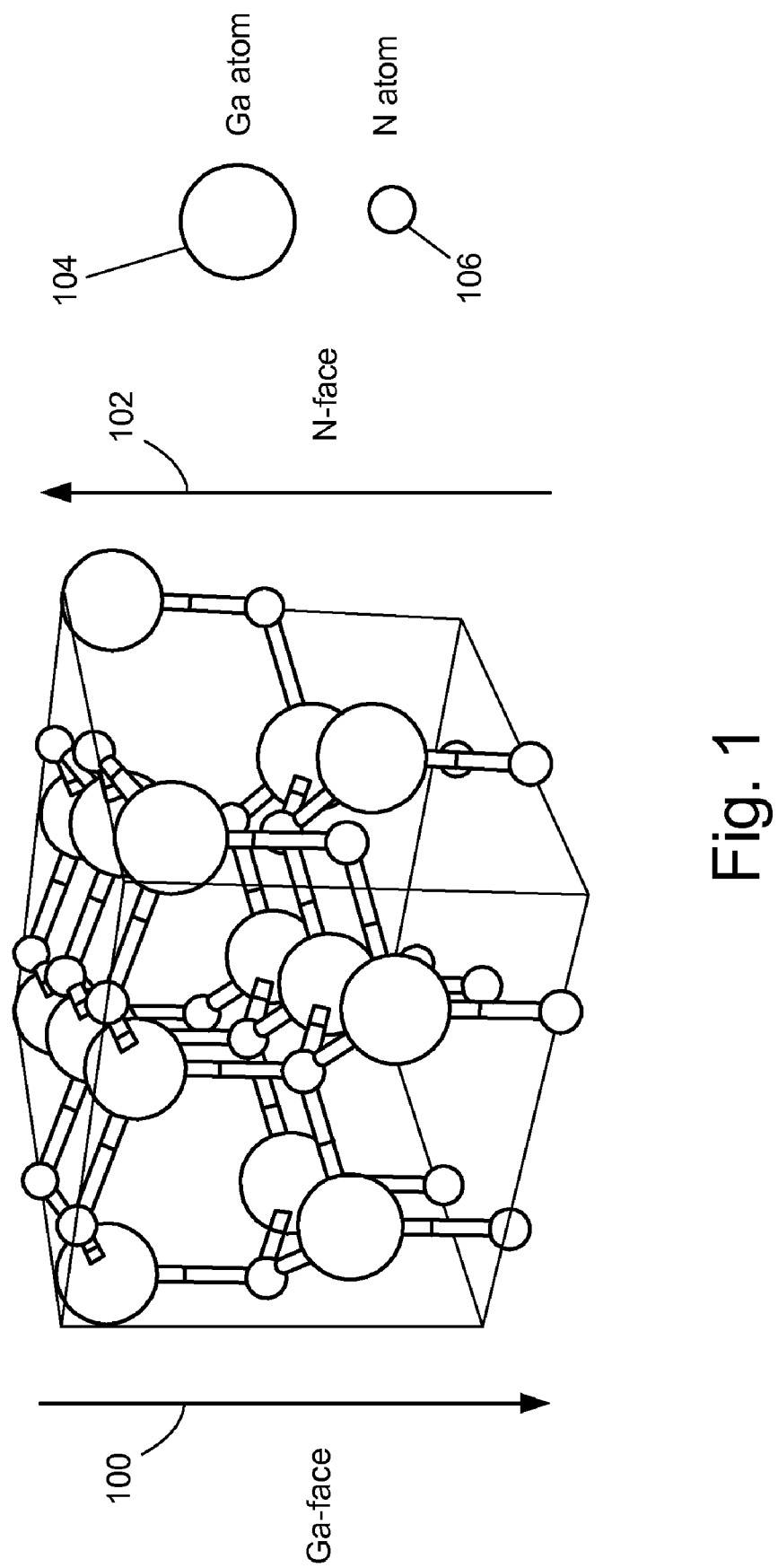
FIG. 1 shows the atomic configuration of GaN on Ga- and N-faces.
Figure 2:
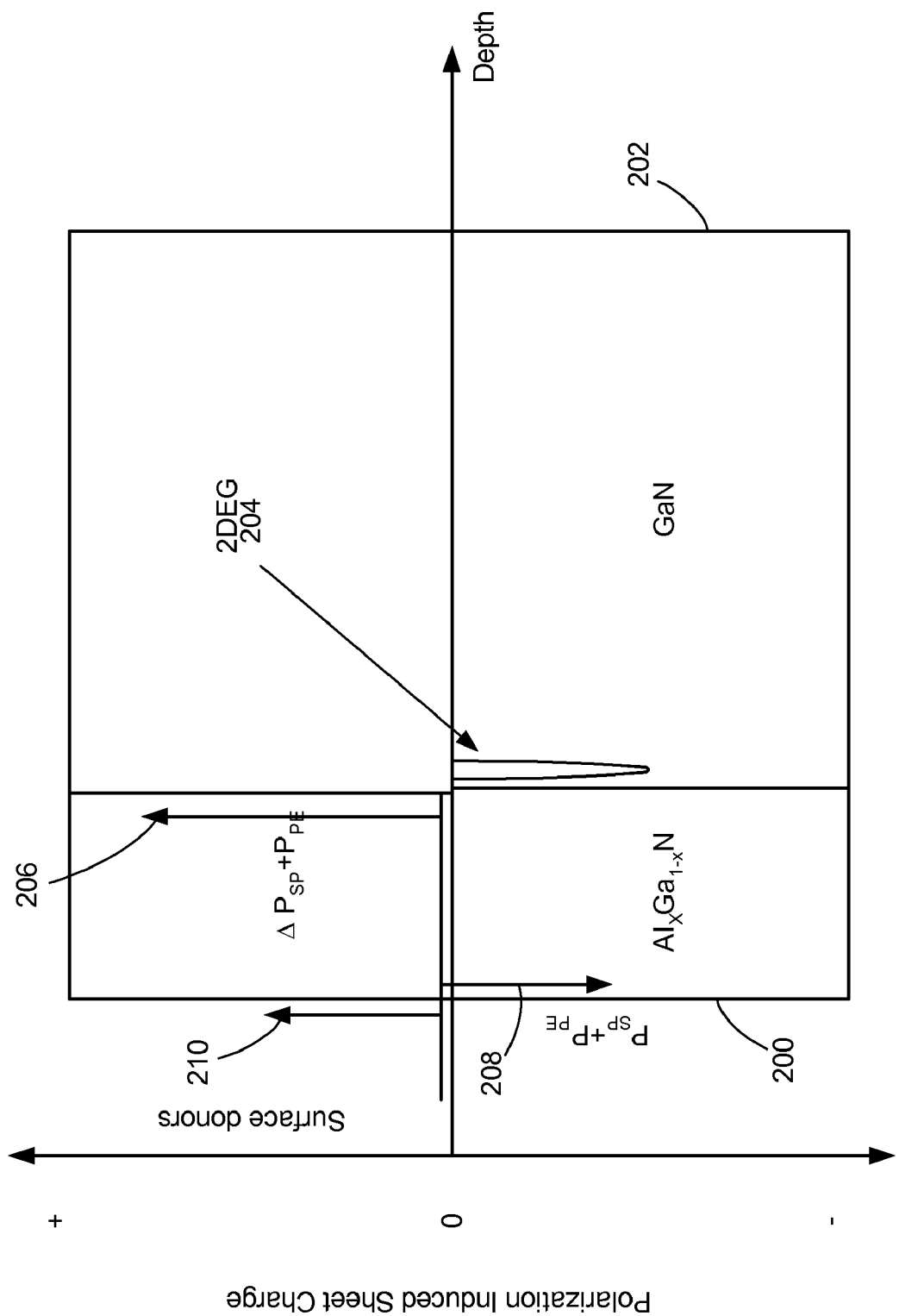
FIG. 2 shows polarization-induced sheet charge in an AlGaN/GaN heterostructure as a function of depth through the heterostructure.

Specifically, FIG. 2 illustrates the polarization induced sheet charge as a function of depth through a heterostructure of $Al_xGa_{1-x}N$ 200 on GaN 202, illustrating a two dimensional electron gas 204 confined in the GaN 202 by the AlGaN 200, polarization induced sheet charge $\Delta P_{SP}+P_{PE}$ 206 induced at the interface between the GaN 202 and AlGaN 200, polarization induced sheet charge $P_{SP}+P_{PE}$ 208 induced at the surface of the AlGaN 200, and surface donors 210. These sheets of charge 206 create a very high electric field in the top semiconductor layer 200 which can be used to modify the band diagram in these materials 200.

The present invention describes a new structure that uses the very high polarization of nitride semiconductors to create potential barriers in the band diagram of N-face devices. These potential barriers can be used to increase the confinement of the electrons in a two-dimensional electron gas (2DEG), reduce the gate leakage by increasing the effective barrier to tunneling, increase the mobility of the electrons in the 2DEG by reducing the overlap of their wave-function with the buffer and/or barrier, etc. A similar structure can also be used to modify the valence band with the goal of modifying the confinement of holes.

FIG. 3($a$) is a schematic of a conduction band 300 as a function of position through a structure comprising a III-nitride interlayer (AlN), or junction, between a first III-nitride layer (GaN) and a second III-nitride layer (GaN). FIG. 3($a$) shows the first GaN layer's conduction band energy 302, the AlN layer's conduction band energy 304, the second GaN layer's conduction band energy 306, the conduction band discontinuity $\Delta E_C$ between the first GaN layer and the AlN layer, the conduction band discontinuity $\Delta E_C$ between the second GaN layer and the AlN layer, and $\Delta E_P$ which is the potential barrier created by the AlN layer junction between the first and second GaN layers and experienced by electrons in the second GaN layer at the interface with the AlN layer.

FIG. 3($b$) is a schematic of a conduction band 308 approximating the conduction band 300 of FIG. 3($a$), showing the junction of FIG. 3($a$) can be modeled as a pseudoheterojunction between the first GaN layer and the second GaN layer with the potential barrier $\Delta E_P$ resulting from the effective conduction band discontinuity between the first GaN layer and the second GaN layer.

FIG. 3($c$) is a schematic of a conduction band 310 as a function of position through a structure comprising a III-nitride interlayer (InGaN), or junction, between a first III-nitride layer (GaN) and a second III-nitride layer (GaN). FIG. 3($c$) shows the first GaN layer's conduction band energy 312, the InGaN layer's conduction band energy 314, the second GaN layer's conduction band energy 316, the conduction band energy discontinuity $\Delta E_C$ between the first GaN layer and the InGaN layer, the conduction band energy discontinuity $\Delta E_C$ between the second GaN layer and the InGaN layer, and $\Delta E_P$ which is the potential barrier created by the InGaN layer junction between the first and second GaN layers and experienced by electrons in the second GaN layer at the interface with the InGaN layer.

FIG. 3($d$) is a schematic of a conduction band 318 approximating the conduction band 310 of FIG. 3($c$), showing the junction of FIG. 3($c$) can be modeled as a pseudoheterojunction between the first GaN layer of FIG. 3(c) and the second GaN layer of FIG. 3(c), with the potential barrier $\Delta E_P$ resulting from the effective conduction band discontinuity between the first GaN layer and the second GaN layer.

The N-face direction 320 is also illustrated in FIGS. 3(a)-3(d), and the Fermi level $E_F$ is illustrated in FIGS. 3(a)-3(b).

The present invention covers two different structures. In the first structure (FIG. 3(c) and FIG. 3(d)), the present invention creates a potential barrier $\Delta E_P$ in the growth direction, by embedding an ultra thin layer of InGaN between two layers of semiconductor with higher polarization coefficients (see FIGS. 3(c) and 3(d)), for example, GaN or AlGaN. In the second structure (FIG. 3(a) and FIG. 3(b)), the present invention creates a potential barrier $\Delta E_P$ opposite to the direction of growth, by embedding an ultra thin layer of AlGaN (AlGaN is the more general description, but AlN, which is $Al_xGa_{1-x}N$ with x=1, is also possible) between two layers of semiconductor with lower polarization coefficients (see FIG. 3(a) and FIG. 3(b)), for example, GaN or InGaN. In both cases, the difference in the polarization coefficients induces a high electric field in the ultra thin InGaN or AlGaN layer which raises or lowers the conduction band of the bottom layer 302, 312 with respect to the top layer's conduction band 306, 316. The total shift in the conduction band $\Delta E_P$ due to the introduction of the interlayers is equal, in a first approximation, to the thickness of the InGaN or AlGaN interlayers multiplied by the polarization-induced electric field inside the interlayers. The thickness of the InGaN or AlGaN interlayers is given by the following constraints:

An interlayer which is too thin will induce a very small potential barrier (e.g. <0.1 eV).

The maximum thickness of the interlayer is limited by the critical thickness that can be grown without relaxing the interlayer.

By using these polarization-induced potential barriers, different devices with improved performance can be fabricated. Some of them are described below. However, many other applications can be envisioned for the described structure in electronic and optoelectronic applications.

Examples of Applications of N-face Polarization-Induced Barriers

AlN Back-Barrier

Figure 4B:
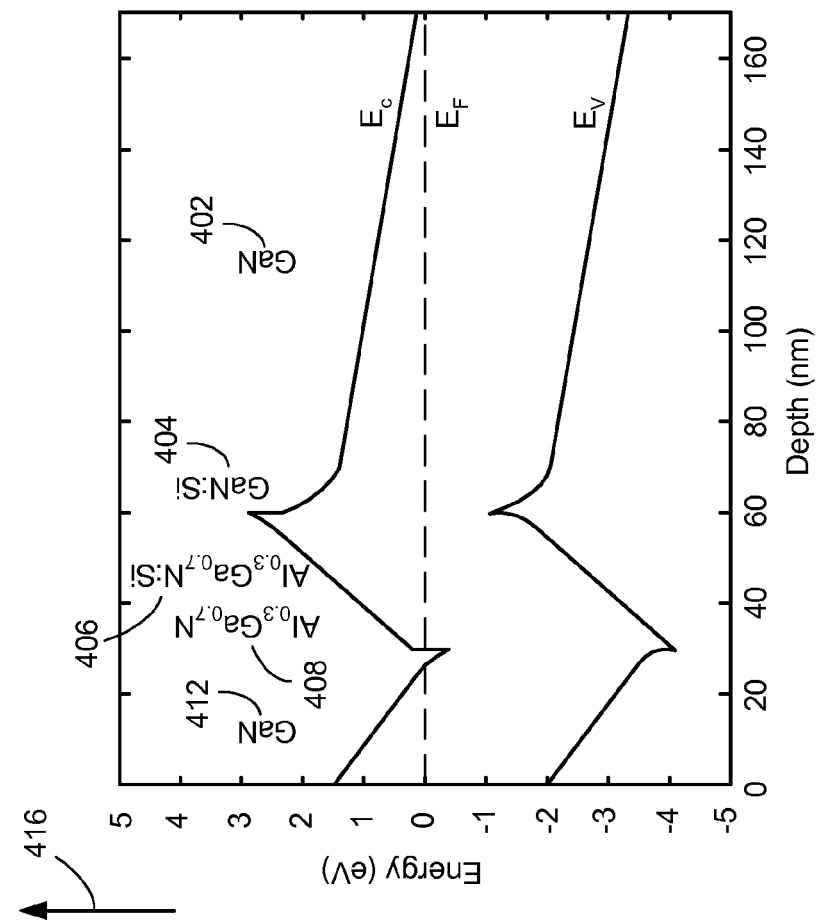
FIG. 4($a$) is a schematic of a standard N-face HEMT structure, and FIG. 4($b$) is the band diagram through the structure of FIG. 4($a$).
Figure 4A:
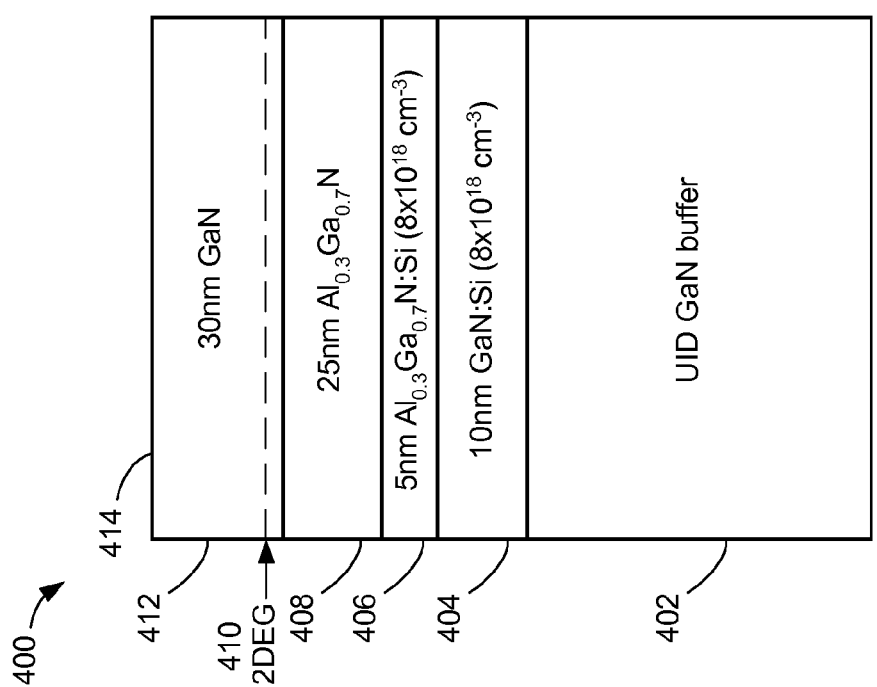

FIG. 4(a) shows the structure 400 of a standard AlGaN/GaN HEMT grown on an N-face GaN template. The device 400 comprises an unintentionally doped (UID) GaN buffer layer 402, a 10 nm thick GaN layer (doped with $8 \times 10^{18}$ cm$^{-3}$ Si concentration) 404, a 5 nm thick $Al_{0.3}Ga_{0.7}N$ layer (doped with $8 \times 10^{18}$ cm$^{-3}$ Si concentration) 406, a 25 nm thick $Al_{0.3}Ga_{0.7}N$ layer 408, a 2DEG 410, and a 30 nm thick GaN layer 412. FIG. 4(b) shows the band diagram through the structure in FIG. 4(a), plotting the Fermi level $E_F$, conduction band energy $E_C$, and valence band energy $E_V$, wherein depth=0 corresponds to the top surface 414 of the GaN layer 412. The N-face growth direction 416 is also illustrated in FIG. 4(a).

In this device 400, the 2DEG 410 forms on top of the AlGaN layer 408 and the mobility of the electrons is degraded by the alloy scattering with the AlGaN bottom layer 408. The electron mobility in state of the art samples with this basic structure is 1300 cm$^2$/Vs. The degradation is especially important when the device approaches pinch-off as the electrons are being pushed toward the AlGaN layer 408 by the gate electric field. To reduce this degradation and increase the electron mobility, the present invention proposes an AlN back-barrier between the 2DEG channel 410 and the AlGaN bottom layer 408. A typical example of the proposed structure of the present invention is shown in FIG. 5(a).

Figures 5A, 5B:
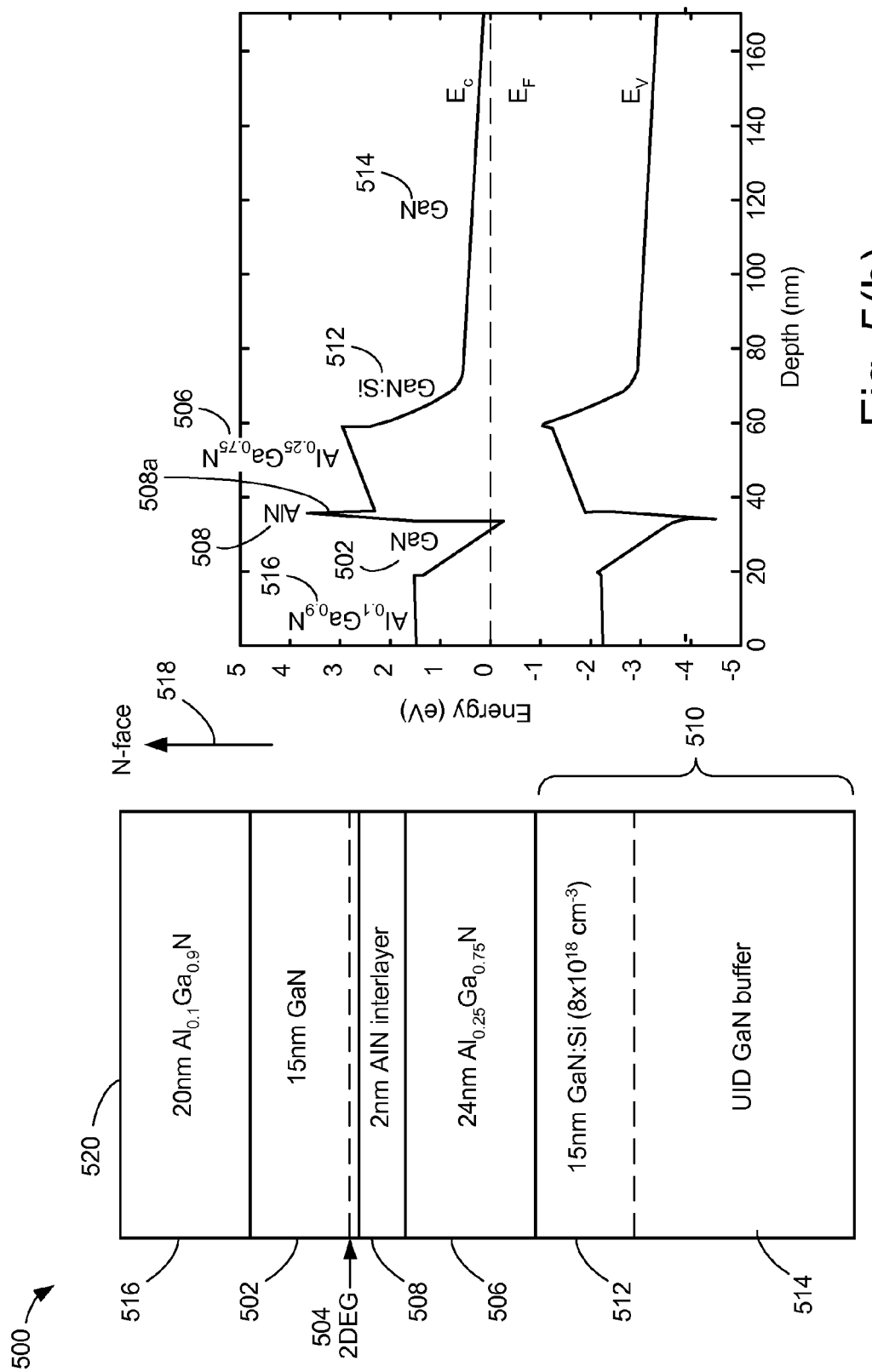
FIG. 5($a$) is a schematic of an N-face HEMT with AlN interlayer, and FIG. 5($b$) is the band diagram through the structure of FIG. 5($a$).

FIG. 5(a) is a schematic cross section of a device structure 500 for a HEMT, comprising a first III-nitride layer (an (Al,Ga,In)N channel layer 502) for containing a 2DEG 504, a second III-nitride layer (an $Al_xGa_{1-x}N$ barrier layer 506 with $0 \leq x \leq 1$) positioned to confine the 2DEG 504 in the (Al,Ga,In)N channel layer 502, and a III-nitride interlayer 508 between the $Al_xGa_{1-x}N$ barrier layer 506 and the (Al,Ga,In)N channel layer 502, wherein the III-nitride interlayer 508 has a higher polarization coefficient than the $Al_xGa_{1-x}N$ barrier layer 506 and the (Al,Ga,In)N channel layer 502.

In the example of FIG. 5(a), the device 500 is grown on a buffer layer 510 comprising a 15 nm thick GaN layer 512 (doped with $8 \times 10^{18}$ cm$^{-3}$ Si concentration) on a UID GaN buffer layer 514, the device 500 is capped with a 20 nm thick $Al_{0.1}Ga_{0.9}N$ layer 516, the barrier layer 506 is a 24 nm thick $Al_{0.25}Ga_{0.75}N$ layer, the channel layer 502 is a 15 nm thick GaN layer and the III-nitride interlayer 508 is a 2 nm thick AlN interlayer. The nitride interlayer may be $Al_yGa_{1-y}N$ with y>x (where x=0.25 in this example) or y>0, or $In_yAl_xGa_{1-x-y}N$ with x+y=1, for example. The N-face orientation 518 (which is also the growth direction) is also shown.

FIG. 5(b) shows the band diagram through the structure in FIG. 5(a), plotting $E_F$, $E_C$, and, $E_V$, wherein depth=0 corresponds to the top surface 520 of the AlGaN layer 516. FIG. 5(b) shows a thickness and polarization induced electric field of the nitride interlayer 508 increases a potential barrier 508a between the $Al_xGa_{1-x}N$ barrier layer 506 and the (Al,Ga,In)N channel layer 502, and the thickness of the nitride based alloy layer 508 may be less than 20 nm or small enough such that the III-nitride interlayer 508 has strain or is not relaxed due to lattice mismatch with at least one of the first III-nitride layer 502 and second III-nitride layer 506.

Figures 6A, 6B:
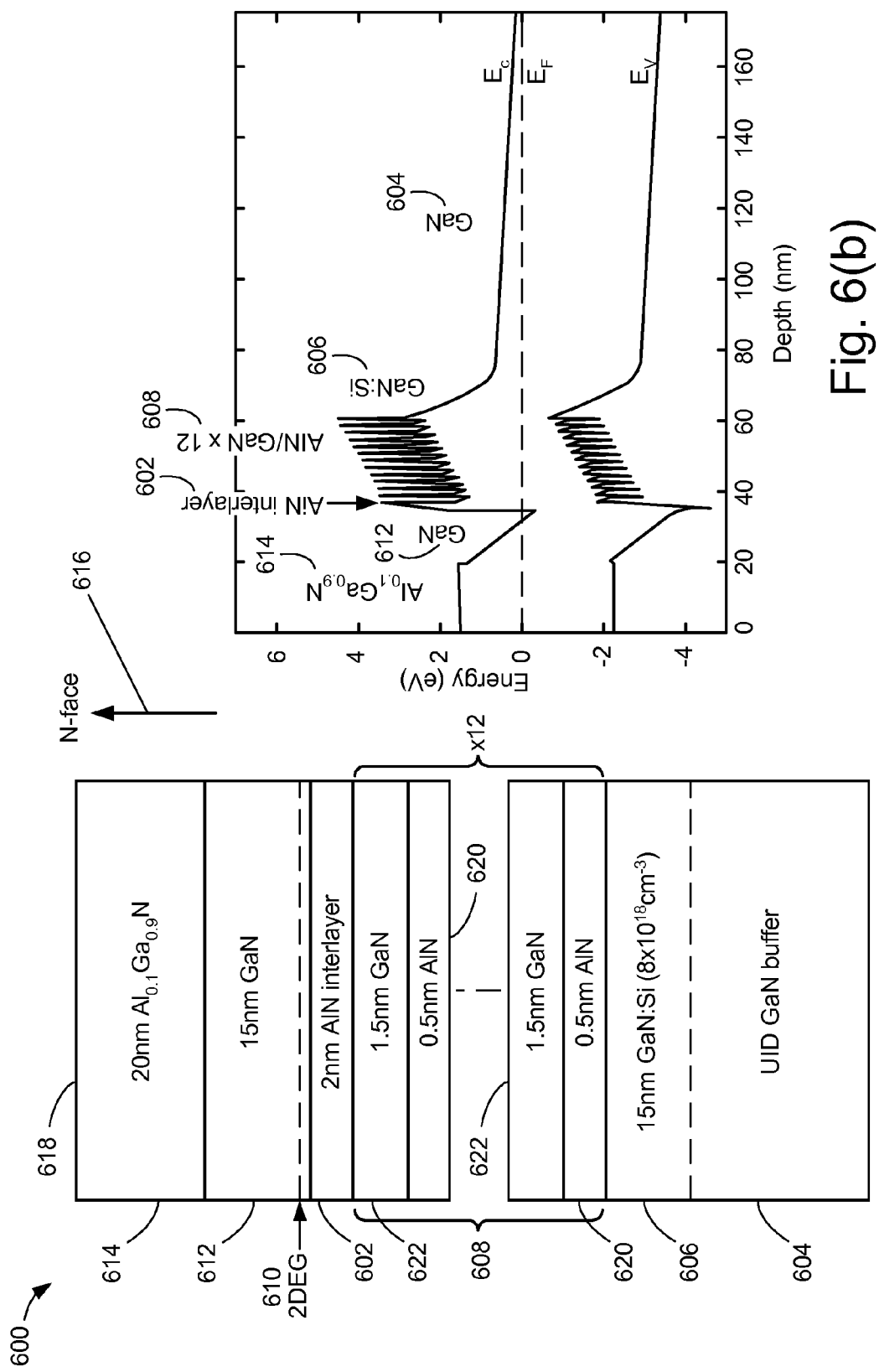
FIG. 6($a$) is a schematic of an N-face HEMT with AlN interlayer and digital AlGaN barrier, and FIG. 6($b$) is the band diagram through the structure of FIG. 6($a$).

FIG. 6(a) is a cross-sectional schematic of a structure 600 of an N-face HEMT with an AlN interlayer 602, comprising a UID GaN buffer layer 604, a 15 nm thick GaN layer (doped with $8 \times 10^{18}$ cm$^{-3}$ Si concentration) 606, an AlGaN layer 608, a 2 nm thick AlN interlayer 602, a 2DEG 610, a 15 nm thick GaN layer 612, and a 20 nm thick $Al_{0.1}Ga_{0.9}N$ layer 614. The N-face direction 616, which is also the growth direction, is also shown.

FIG. 6(b) shows the band diagram through the structure in FIG. 6(a), plotting $E_F$, $E_C$, and, $E_V$, wherein depth=0 corresponds to the top surface 618 of the AlGaN layer 614. The AlGaN layer 608 comprises 12 layers of 0.5 nm thick AlN 620 alternating with 12 layers of 1.5 nm thick GaN 622.

Due to the electric fields induced in the AlN back-barrier 602, the effective conduction band discontinuity seen by the electrons between the channel 612 and the AlGaN barrier 608 has been increased by an amount in excess of 1.5 eV, when compared to the barrier height without the AlN back-barrier in the example shown in FIG. 4. As a result of the higher barrier height, the overlapping of the wave function of the electrons with the bottom AlGaN layer 608 is significantly reduced. Due to this reduced overlap, the effect of the alloy scattering is less important and the electron mobility increases more than 20% to values in excess of 1700 cm$^2$/Vs.

The most general description of this new structure is comprised of (from bottom to top):

A buffer layer 510 made of (Al, Ga, In)N and comprised of one or more sublayers 512, 514 in order to provide low buffer leakage, good isolation, accommodate strain and provide good growth morphology to the layers above it.

An $Al_xGa_{1-x}N$ layer 506, that can also be digitally grown (608 in FIG. 6), that will provide the polarization needed to confine the 2DEG channel 504. This layer can be graded and doped if needed.

An ultra-thin (<20 nm) $Al_yGa_{1-y}N$ layer 508 where y>x. The difference in polarization between this layer 508 and the layer 506 will induce high electric fields which will create a potential barrier downwards of the growth direction (i.e. opposite the direction 518). This is the layer that is a key element of the present invention.

An (Al,Ga,In)N channel layer 502 with bandgap lower than in the $Al_xGa_{1-x}N$ layer 506 which will be the channel where the 2DEG 504 will form.

The sample may be finished by one or more cap layers 516 made of (Al,Ga,In)N with a bandgap to provide enhancement mode or any other functionality as described in previous disclosures and papers (see, for example, [10], which is a paper describing a possible design). This layer 516 can be doped p-type to generate an enhancement mode device and/or to give stability to the device.

The sample may be capped with an insulating layer to fabricate metal-insulator-semiconductor structures. This insulating layer can be a wide bandgap semiconductor like AlN or any other dielectric layer (not shown).

A GaN (or InN) spacer can be added between layers 508 and 506 to improve the transport properties of the electrons in the channel 502, or an etch-stop barrier may be added, etc.

InGaN Top-Barrier

In N-face AlGaN/GaN HEMTs, the electron confinement is better from the bottom of the device than from the top. This is opposite to what happens in Ga-face devices where the AlGaN barrier layer creates a strong top confinement. The lack of top confinement degrades the performance of these N-face devices in many different ways:

Poor linearity due to the varying channel-to-gate distance.
High gate leakage due to easy tunneling through the GaN barrier into the channel.
Poor power performance due to trap-related dispersion at the interface with the barrier.

The use of an ultra thin layer of InGaN on top of the electron channel induces a top potential barrier, which can be used in many applications. One of these applications could be to increase the electron confinement in the channel. A diagram of the proposed structure is shown in FIGS. 7(a) and 7(b). The sample with InGaN top-barrier presents much high carrier confinement than the standard HEMT due to its quantum well-like band diagram.

FIG. 7(a) is a schematic cross-section of a device structure 700 for a HEMT, comprising a first III-nitride layer (an (Al, Ga,In)N channel layer 702) containing a 2DEG 704, an $Al_xGa_{1-x}N$ barrier layer 706, with $0 \leq x \leq 1$, positioned to confine the 2DEG 704 in the (Al,Ga,In)N channel layer 702; a second III-nitride layer (a III-nitride cap 708); and a III-nitride interlayer (a III-nitride top-barrier layer 710) between the III-nitride cap 708 and the (Al,Ga,In)N channel layer 702, for providing a top-barrier to confine the 2DEG 704 in the channel layer 702, wherein the III-nitride top-barrier layer 710 has a lower polarization coefficient than the (Al,Ga,In)N channel layer 702 and the III-nitride cap layer 708.

The device structure 700 further comprises a III-nitride interlayer 712 between the $Al_xGa_{1-x}N$ barrier layer 706 and the (Al,Ga,In)N channel layer 702 and a GaN spacer layer 714 between the III-nitride top-barrier layer 710 and III-nitride cap layer 708.

In the example of FIG. 7(a), the device 700 is grown on a buffer layer 716 comprising a 15 nm thick GaN layer 718 (doped with $8 \times 10^{18}$ cm$^{-3}$ Si concentration) on a UID GaN buffer layer 720. The cap layer 708 is a 20 nm thick $Al_{0.1}Ga_{0.9}N$ layer, the barrier layer 706 is a 24 nm thick $Al_{0.25}Ga_{0.75}N$ layer, the channel layer 702 is a 15 nm thick GaN layer, the III-nitride top-barrier 710 is a 1.5 nm thick $In_{0.2}Ga_{0.8}N$ interlayer, the layer 712 is a 2 nm thick AlN interlayer and the GaN spacer layer 714 is 7.5 nm thick. The N-face orientation 722 (which is also the growth direction) is also shown.

FIG. 7(b) shows the band diagram through the structure in FIG. 7(a), plotting $E_F$, $E_C$, and $E_V$, wherein depth=0 corresponds to the top surface 724 of the AlGaN layer 708. FIG. 7(b) shows how a thickness and polarization induced electric field of the III-nitride top-barrier layer 710 increases a potential barrier between the channel layer 702 and the III-nitride cap layer 708, thereby increasing confinement of the 2DEG in the channel layer 702. The thickness of the III-nitride top-barrier layer 710 may be less than 20 nm or small enough such that the III-nitride top-barrier layer 710 has strain or is not relaxed, for example, due to lattice mismatch with at least one of the first III-nitride layer 702 and the second III-nitride layer 708.

FIG. 8(a) is a cross-sectional schematic of a structure 800 of an N-face HEMT with an AlN interlayer 802 and an InGaN top-barrier 804, comprising a UID GaN buffer layer 806, a 15 nm thick GaN layer (doped with $8 \times 10^{18}$ cm$^{-3}$ Si concentration) 808, an AlGaN layer 810, a 2 nm thick AlN interlayer 802, a 2DEG 812, a 6 nm thick GaN layer 814, a 1.5 nm thick $In_{0.2}Ga_{0.8}N$ layer 804, a 7.5 nm thick GaN spacer layer 816, and a 20 nm thick $Al_{0.1}Ga_{0.9}N$ layer 818. The N-face direction 820 is also shown.

FIG. 8(b) shows the band diagram through the structure in FIG. 8(a), plotting $E_F$, $E_C$, and $E_V$, wherein depth=0 corresponds to the top surface 822 of the AlGaN layer 818. The AlGaN layer 810 comprises 12 layers of 0.5 nm thick AlN 824 alternating with 12 layers of 1.5 nm thick GaN 826.

The most general description of this new structure is comprised of (from bottom to top):

A buffer layer 716 made of (Al, Ga, In)N and comprised of one or more sublayers 718, 720 in order to provide low buffer leakage, good isolation, accommodate the strain from the buffer layer 716 and provide good growth morphology to the layers above it.

An $Al_xGa_{1-x}N$ layer 706, that can also be digitally grown (810 in FIG. 8), that will provide the polarization needed to confine the 2DEG channel 704. This layer can be graded and doped if needed.

An (Al,Ga,In)N channel layer 702 with bandgap lower than in the $Al_xGa_{1-x}N$ layer 706 which will be the channel where the 2DEG 704 will form.

An ultra-thin (<20 nm) $In_yGa_{1-y}N$ layer 710 with lower polarization coefficients than layer 702. The difference in polarization between this layer 710 and the layer 702 will induce high electric fields which will create a potential barrier upward in the growth direction 722. This is the layer that is a key element of the present invention.

The sample may be finished by a cap layer 708 made of (Al,Ga,In)N with a bandgap to provide enhancement mode or any other functionality as described in previous disclosures and papers (see, for example, [10], which is a paper describing a possible design). This layer 708 can be doped p-type to generate an enhancement mode device and/or to give stability to the device.

The sample may be capped with an insulating layer to fabricate metal-insulator-semiconductor structures. This insulating layer can be a wide bandgap semiconductor like AlN or any other dielectric layer (not shown).

The InGaN top-layer 710 can also be combined with the AlN back-barrier 712 to fabricate a transistor with very high electron confinement.

N-Face GaN-Spacer HEMT

Figures 9A, 9B:
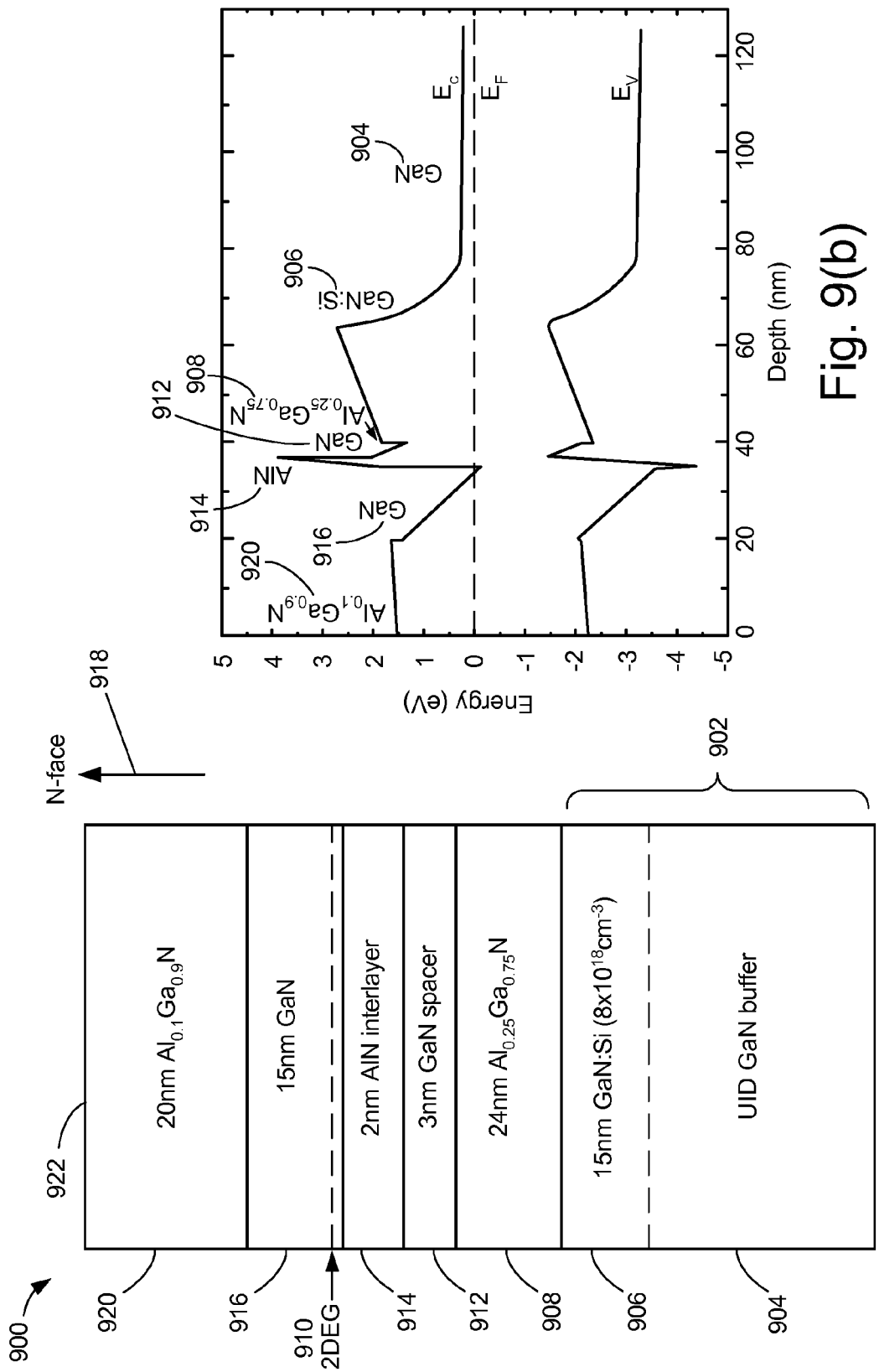
FIG. 9($a$) is a schematic of an N-face HEMT with AlN interlayer and GaN spacer at the bottom, and FIG. 9($b$) is the band diagram through the structure of FIG. 9($a$).

The use of polarization induced barriers in the conduction band of N-face devices also allows the fabrication of GaN-spacer HEMTs where the channel electrons are far away from the AlGaN barrier, if any. FIG. 9(a) illustrates the most basic structure of this new N-face transistor 900, which includes:

- A buffer layer 902 made of (Al, Ga, In)N and comprised of one or more sublayers 904, 906 in order to provide low buffer leakage, good isolation, accommodate strain and provide good growth morphology to the layers above it. The sublayers may be UID GaN 904 and a 15 nm thick GaN layer doped with doped with $8 \times 10^{18}$ cm$^{-3}$ Si concentration 906.
- An $Al_xGa_{1-x}N$ layer 908, that can also be digitally grown (608 in FIG. 6), that will provide the polarization needed to confine the 2DEG channel 910. This layer 908 can be graded and doped if needed.
- A GaN layer 912 which will form the "GaN-spacer" and which will increase the distance between the electron channel 910 and layer 908. This is a key element of the present invention.
- An ultra-thin (<20 nm) $Al_yGa_{1-y}N$ layer 914 where y>0. The difference in polarization between this layer 914 and the layer 908 will induce high electric fields which will create a potential barrier downwards of the growth direction (i.e. opposite the growth direction 918). This is a key element of the present invention.
- An (Al,Ga,In)N channel layer 916 where the 2DEG 910 will form.
- The sample may be finished by one or more cap layers 920 made of (Al,Ga,In)N with a bandgap to provide enhancement mode or any other functionality as described in previous disclosures and papers (see, for example, [10], which is a paper describing a possible design). This layer 920 can be doped p-type to generate an enhancement mode device and/or to give stability to the device.
- The sample may be capped with an insulating layer to fabricate metal-insulator-semiconductor structures (not shown).

FIG. 9(b) shows the band diagram through the structure in FIG. 9(a), plotting $E_F$, $E_C$, and, $E_v$, wherein depth=0 corresponds to the top surface 922 of the AlGaN layer 920.

The previous structure can also be modified in the following way:

The devices can be designed without layer 908.

The electrons for the channel can also be provided by doping layers 902, 906, 908, 912, 914 and/or 920.

While a GaN spacer layer is used in the example structures described above, the spacer layer 912 can be any III-nitride and is not limited to GaN or InN.

Figures 10A, 10B:
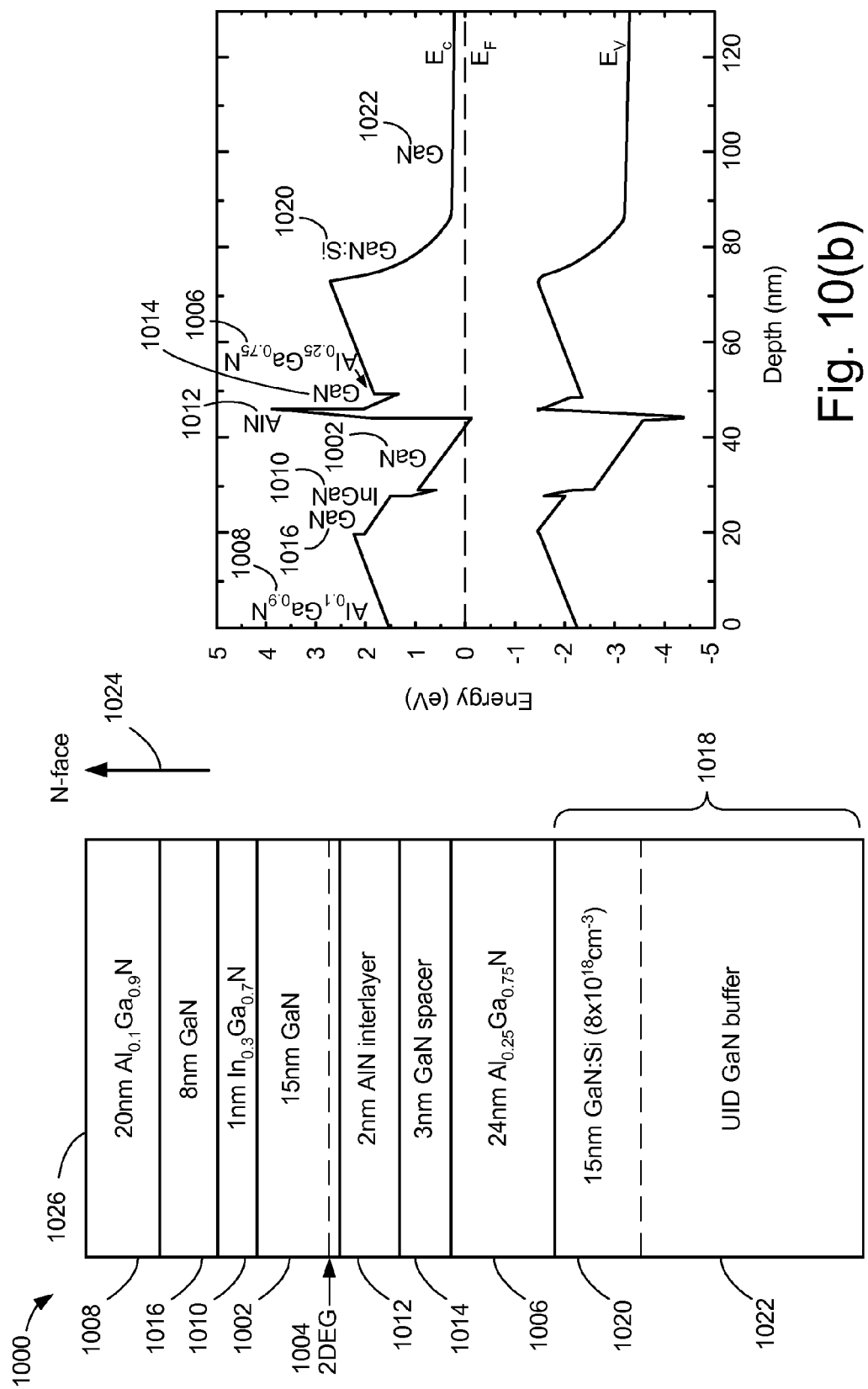
FIG. 10($a$) is a schematic of an N-face HEMT with AlN interlayer and GaN spacers at the bottom and the top, and FIG. 10($b$) is the band diagram through the structure of FIG. 10($a$).

FIG. 10(a) is a schematic cross-section of a device structure 1000 for a HEMT, comprising an (Al,Ga,In)N channel layer 1002, containing a two dimensional electron gas (2DEG) 1004, an $Al_xGa_{1-x}N$ barrier layer 1006, with $0 \leq x \leq 1$, for confining the 2DEG 1004 in the (Al,Ga,In)N channel layer 1002; a III-nitride cap 1008; and a III-nitride top-barrier layer 1010 between the III-nitride cap 1008 and the (Al,Ga,In)N channel layer 1002, for providing a top-barrier to confine the 2DEG 1004 in the channel layer 1002, wherein the III-nitride top-barrier layer 1010 is InGaN (for example, a 1 nm thick $In_{0.3}GaN_{0.7}$ layer) and has a quantum well-like band diagram. The device 1000 further comprises a III-nitride interlayer 1012 between the $Al_xGa_{1-x}N$ barrier layer 1006 and the (Al,Ga,In)N channel layer 1002 and a first GaN spacer layer 1014 between the III-nitride interlayer 1012 and the $Al_xGa_{1-x}N$ barrier layer 1006, wherein the III-nitride interlayer 1012 interfaces the channel layer 1002 and the GaN spacer layer 1014, and the GaN spacer layer 1014 interfaces the interlayer 1012 and the barrier layer 1006.

FIG. 10(a) shows the device can also have a second GaN-spacer 1016 on top of the GaN channel 1002, by using an InGaN top-barrier 1010 as described in previous sections and a GaN spacer 1016 between the InGaN 1010 and the AlGaN cap layer 1008.

In the example of FIG. 10(a), the device 1000 is grown on a buffer layer 1018 comprising a 15 nm thick GaN layer 1020 (doped with $8 \times 10^{18}$ cm$^{-3}$ Si concentration) on a UID GaN buffer layer 1022. The cap layer 1008 is a 20 nm thick $Al_{0.1}Ga_{0.9}N$ layer, the barrier layer 1006 is a 24 nm thick $Al_{0.25}Ga_{0.75}N$ layer, the channel layer 1002 is a 15 nm thick GaN layer, the III-nitride top-barrier 1010 is a 1 nm thick $In_{0.3}GaN_{0.7}$ layer, the III-nitride interlayer 1012 is 2 nm thick AlN, the first GaN spacer 1014 layer is 3 nm thick, and the second GaN spacer 1016 layer is 8 nm thick. The N-face growth direction 1024 is also shown.

FIG. 10(b) shows the band diagram through the structure in FIG. 10(a), plotting $E_F$, $E_C$, and, $E_v$, wherein depth=0 corresponds to the top surface 1026 of the AlGaN layer 1008. FIG. 10(b) shows that a thickness and polarization induced electric field of the nitride top-barrier layer 1010 increases a potential barrier between the AlGaN cap layer 1008 and the (Al,Ga,In)N channel layer 1002, and the quantum well like band diagram of the InGaN interlayer 1010.

This structure is expected to have much better transport properties than conventional devices. One of the reasons for this improved transport is the lower alloy scattering resulting from the additional separation between the 2DEG 910 and the AlGaN barrier 908. Other applications for this novel structure can be envisioned such as etch stop layers, improved contacts, selective activation of implanted species, etc.

The three examples given above are only examples to illustrate the power of using thin layers of semiconductor to induce an effective conduction band discontinuity in the band diagram of N-face devices. Other materials like AlInGaN can be used instead of InGaN or AlGaN. Also, the semiconductor at both sides of the thin semiconductor layer does not need to be the same. Structures such as GaN/ultra-thin InGaN/AlGaN or GaN/ultra-thin AlGaN/AlGaN are also covered by this disclosure, for example.

Process Steps

Figure 11:
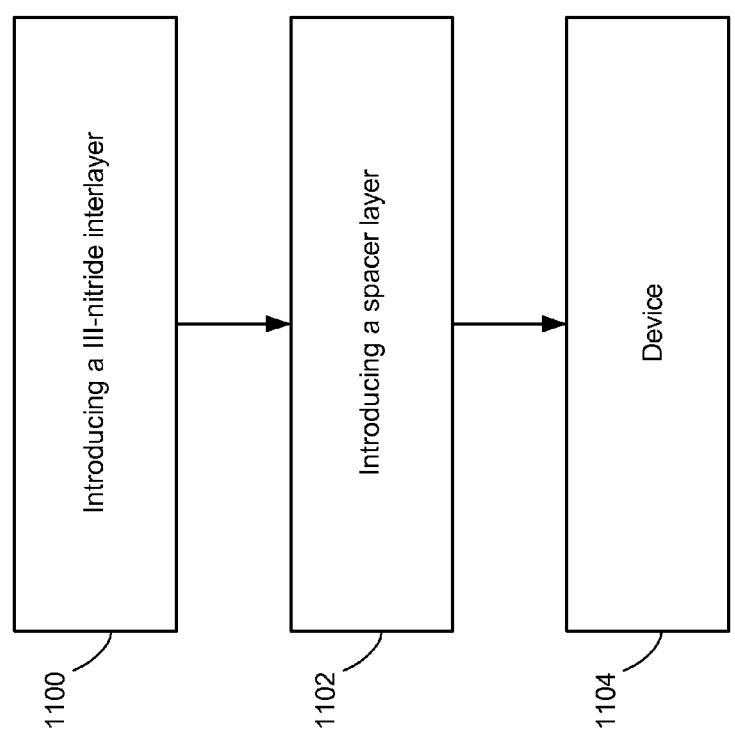
FIG. 11 is a flowchart illustrating a method of the present invention.

FIG. 11 is a flowchart illustrating a method for fabricating a potential barrier for an N-face nitride-based electronic device according to an embodiment of the present invention.

Block 1100 represents the step of introducing and using a thickness and polarization induced electric field of a III-nitride interlayer, positioned between a first III-nitride layer and a second III-nitride layer, to raise or lower the first III-nitride layer's energy band with respect to the second III-nitride layer's energy band by a pre-determined amount, wherein (1) both the first III-nitride layer and the second III-nitride layer have a different polarization coefficient than the III-nitride interlayer's polarization coefficient, (2) both the first III-nitride layer and the second III-nitride layer have a different group III composition than the group III composition of the III-nitride interlayer, and (3) the pre-determined amount is proportional to the thickness and the polarization induced electric field of the III-nitride interlayer. The III-nitride interlayer, first III-nitride layer, and second III-nitride layer are typically N-face oriented semiconductor layers, for example.

The III-nitride interlayer may interface the first III-nitride layer and the second III-nitride layer. The first III-nitride layer and the second III-nitride layer may have a same III-nitride composition. The first III-nitride layer and the second III-nitride layer may be selected from a group comprising GaN or AlGaN and the III-nitride interlayer may be selected from a group comprising InGaN or AlInGaN. The first III-nitride layer and second III-nitride layer may be selected from a group comprising GaN or (Al)InGaN and the III-nitride interlayer may be AlGaN. The pre-determined amount may be in excess of 1.5 eV.

Block 1102 represents the step of introducing a spacer layer, for example, a GaN spacer layer, positioned between the first III-nitride layer and the second III-nitride layer.

Block 1104 represents the step of fabricating a device using the method. For example, the device may be a High Electron Mobility Transistor (HEMT), the first III-nitride layer may be a barrier layer of the HEMT, the second III-nitride layer may be a channel layer containing channel electrons of the HEMT, and the III-nitride interlayer may be a back-barrier positioned between the channel layer and the barrier layer to reduce the alloy scattering of channel electrons and increase their mobility compared to a device without the III-nitride interlayer.

For example, the device may be a HEMT, the first III-nitride layer may be a channel layer containing channel electrons of the HEMT, the second III-nitride layer may be a cap layer beneath a gate of the HEMT, and the III-nitride interlayer may be a top-barrier positioned between the channel layer and the cap layer so that the gate has reduced gate leakage and the channel electrons experience enhanced confinement compared to a device without the III-nitride interlayer.

In another example, the method may further comprise introducing a GaN spacer layer positioned between the III-nitride interlayer and the second III-nitride layer, wherein the first III-nitride layer is a channel layer for containing channel electrons, the III-nitride interlayer is a III-nitride back-barrier interlayer, the second III-nitride layer acts as a barrier layer for the channel electrons, and the GaN spacer layer introduces an additional separation between the channel electrons and the barrier layer to lower alloy scattering as compared to a device without the GaN spacer layer.

The device of block 1104 may be a device structure for creating a polarization induced potential barrier, comprising a III-nitride interlayer positioned between a first III-nitride layer and a second III-nitride layer, wherein at least one of the first III-nitride layer and the second III-nitride layer having a different polarization coefficient than the III-nitride interlayer; and a potential barrier for increasing an energy band discontinuity between the first III-nitride layer and the second III-nitride layer is created and determined by (1) a thickness of the III-nitride interlayer; and (2) a polarization induced electric field of the III-nitride interlayer.

REFERENCES

The following references are incorporated by reference herein:

[1] "Growth and Electrical Characterization of N-face AlGaN/GaN Heterostructures," S. Rajan, M. Wong, Y Fu, F. Wu, J. S. Speck, and U. K. Mishra, Japanese Journal of Applied Physics, Vol. 44, No. 49, pp. L1478-L1480, 2005.

[2] "Advanced Transistor Structures Based on N-face GaN," S. Rajan, A. Chini, M. Wong, C. Suh, Y Fu, M. J. Grundmann, F. Wu, J. S. Speck and U. K. Mishra, 32nd International Symposium on Compound Semiconductors (ISCS), Sep. 18-22, 2005, Europa-Park Rust, Germany.

[3] "N-face Modulation Doped Field Effect Transistors," S. Rajan, F. Wu, M. Wong, Y. Fu, J. S. Speck and U. K. Mishra, 6th International Conference on Nitride Semiconductors (ICNS) 2005, Aug. 28-Sep. 2, 2005, Bremen, Germany.

[4] "Structural and Electrical Characterization of N-face GaN grown on C-face SiC by MBE," Siddharth Rajan; Feng Wu; Manhoi Wong; Yenyun Fu; James S. Speck; Umesh K. Mishra, 47th Electronic Materials Conference, Jun. 22-24, 2005, Santa Barbara, Calif. USA.

[5] "An Experimental Method to Identify Bulk and Surface Traps in GaN HEMTs," A. Chini, Y Fu, S. Rajan, J. S. Speck and U. K. Mishra, 32nd International Symposium on Compound Semiconductors (ISCS), Sep. 18-22, 2005, Europa-Park Rust, Germany.

[6] "Fabrication and Characterization of N-face GaN/AlGaN/GaN HEMTs," A. Chini, S. Rajan, M. Wong, Y. Fu, J. S. Speck, U. K. Mishra, 63rd Device Research Conference, Jun. 20-22, 2005, Santa Barbara, Calif. USA.

[7] "E-Mode GaN HEMTs," C. Suh, T. Palacios, S. Rajan, A. Chini, E. Snow, Y. Dora, L. Shen, C. Poblenz, N. Fitchenbaum, A. Chakraborty, S. Keller, S. DenBaars, J. Speck, U. Mishra, WOCSEMMAD 2006, Phoenix, Ariz.

[8] "AlGaN/GaN High Electron Mobility Transistors With InGaN Back-Barriers," T. Palacios, A. Chakraborty, S. Heikman, S. Keller, S. P. DenBaars, and U. K. Mishra, IEEE Electron Device Letters, Vol. 27, No. 1, Jan. 2006.

[9] U.S. Pat. No. 6,849,882, issued Feb. 1, 2005, by U. K. Mishra et al., entitled "HEMT Structure with Artificially Achieved Staggered Bandgap Line-up or Polarization Induced Dipole Layer"

[10] S. Rajan, A. Chini, M. H. Wong, J. S. Speck, and U. K. Mishra, "N-polar GaN/AlGaN/GaN high electron mobility transistors," J. Appl. Phys., vol. 102, no. 4, 044501, Aug. 2007.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a nitrogen-face (N-face) nitride-based electronic device, comprising:
  using a thickness and a polarization induced electric field of a III-nitride interlayer, positioned between a III-nitride barrier layer and a III-nitride channel layer, to shift the III-nitride barrier layer's energy band with respect to the III-nitride channel layer's energy band by a pre-determined amount proportional to the thickness and the polarization induced electric field of the III-nitride interlayer, wherein:
  (1) both the III-nitride barrier layer and the III-nitride channel layer have a higher polarization coefficient than the III-nitride interlayer's polarization coefficient,
  (2) the III-nitride barrier layer confines channel electrons in the III-nitride channel layer, and
  (3) the III-nitride interlayer, the III-nitride barrier layer, and the III-nitride channel layer each have an N-face orientation.

2. The method of claim 1, wherein the III-nitride interlayer interfaces the III-nitride barrier layer and the III-nitride channel layer.

3. The method of claim 1, wherein the III-nitride barrier layer and the III-nitride channel layer are GaN or AlGaN, and the III-nitride interlayer is InGaN or AlInGaN.

4. The method of claim 1, wherein the III-nitride barrier layer and III-nitride channel layer are GaN or (Al)InGaN, and the III-nitride interlayer is AlGaN or Al(In)GaN.

5. The method of claim 4, wherein the pre-determined amount is in excess of 0.2 eV.

6. The method of claim 1, wherein N-face nitride-based electronic device is a High Electron Mobility Transistor (HEMT) and:
    the III-nitride interlayer is a back-barrier positioned between the III-nitride channel layer and the III-nitride barrier layer, and
    the thickness and the polarization induced electric field of the III-nitride interlayer increases a potential barrier between the III-nitride barrier layer and the III-nitride channel layer to reduce alloy scattering of the channel electrons with the III-nitride barrier layer and increase their mobility, as compared to a HEMT without the III-nitride interlayer.

7. The method of claim 1, further comprising positioning a GaN spacer layer between the III-nitride interlayer and the III-nitride barrier layer, wherein the GaN spacer layer introduces an additional separation between the channel electrons and the III-nitride barrier layer to lower alloy scattering as compared to a device without the GaN spacer layer.

8. The method of claim 1, wherein the III-nitride barrier layer is an $Al_xGa_{1-x}N$ layer, the III-nitride interlayer is an $Al_yGa_{1-y}N$ layer where y>x or y>0, or an $In_yAl_xGa_{1-x-y}N$ layer with x+y=1, and the III-nitride channel layer is an (Al,Ga,In)N channel layer with a bandgap lower than a bandgap of the $Al_xGa_{1-x}N$ layer.

9. The method of claim 8, wherein the III-nitride interlayer interfaces a GaN spacer layer and the (Al, Ga, In)N channel, and the GaN spacer interfaces the III-nitride interlayer and the $Al_xGa_{1-x}N$ barrier.

10. The method of claim 1, wherein a thickness of the III-nitride interlayer is less than 20 nm or small enough such that the III-nitride interlayer is strained due to lattice mismatch with at least one of the III-nitride barrier layer and the III-nitride channel layer.

* * * * *